United States Patent
Cheng et al.

(10) Patent No.: US 11,164,853 B1
(45) Date of Patent: Nov. 2, 2021

(54) CHIP PACKAGE AND MANUFACTURING METHOD THEREOF

(71) Applicant: XINTEC INC., Taoyuan (TW)

(72) Inventors: Chia-Ming Cheng, New Taipei (TW); Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/170,482

(22) Filed: Feb. 8, 2021

(51) Int. Cl.
| | |
|---|---|
| *H01L 23/495* | (2006.01) |
| *H01L 25/16* | (2006.01) |
| *H01L 23/31* | (2006.01) |
| *H01L 23/498* | (2006.01) |
| *H01L 25/00* | (2006.01) |
| *B81B 7/00* | (2006.01) |

(52) U.S. Cl.
CPC .......... *H01L 25/16* (2013.01); *H01L 23/3128* (2013.01); *H01L 23/49822* (2013.01); *H01L 23/49827* (2013.01); *H01L 25/50* (2013.01); *B81B 7/008* (2013.01)

(58) Field of Classification Search
CPC ......... H01L 23/49822; H01L 23/49827; H01L 23/3128; H01L 25/16; H01L 25/50
USPC ......... 257/668, 686, 774; 438/109, 126, 667
See application file for complete search history.

(56) References Cited

U.S. PATENT DOCUMENTS

| | | | | |
|---|---|---|---|---|
| 8,754,514 | B2 * | 6/2014 | Yu | H01L 21/76805 257/686 |
| 9,150,404 | B2 * | 10/2015 | Cheng | H01L 24/19 |
| 9,403,674 | B2 * | 8/2016 | Cheng | H01L 24/19 |
| 9,935,148 | B2 * | 4/2018 | Yiu | H01L 27/14627 |
| 10,510,705 | B2 * | 12/2019 | Lu | H01L 23/3135 |
| 2013/0040423 | A1 * | 2/2013 | Tung | H01L 25/0657 438/107 |

* cited by examiner

*Primary Examiner* — Luan C Thai
(74) *Attorney, Agent, or Firm* — Liu & Liu

(57) ABSTRACT

A chip package includes a first chip, a second chip, a first molding compound, and a first distribution line. The second chip vertically or laterally overlaps the first chip. The second chip has a conductive pad. The first molding compound covers the first and second chips, and surrounds the second chip. The first molding compound has a first through hole. The conductive pad is in the first through hole. The first distribution line is located on a surface of the first molding compound facing away from the second chip, and electrically connects the conductive pad in the first through hole.

13 Claims, 16 Drawing Sheets

100

CHIP PACKAGE AND MANUFACTURING METHOD THEREOF

BACKGROUND

Field of Invention

The present disclosure relates to a chip package and a manufacturing method of the chip package.

Description of Related Art

Chip packages can be formed by bonding a silicon chip and a glass substrate, and then forming a distribution line on the silicon chip through steps including physical vapor deposition, exposure, development, etching, and the like. After the distribution line is formed, the surface of the silicon chip can be covered with a protective layer so as to protect the silicon chip and the distribution line.

However, the size of the chip package is mainly determined by the size of the chip, and the material of the chip is silicon. If the width of the chip package is intended to be increased or decreased to fulfill the product requirements, the size of the silicon chip thus can be selected is limited, which probably increases the material or manufacturing cost of the silicon chip. That is to say, it is not easy to adjust the size of the overall chip package by only adjusting the size of the chip. In addition, the chip needs to undergo an etching process to form a through hole that exposes a conductive pad before the distribution line is formed, so that the distribution line can be electrically connected to the conductive pad. Such a design not only increases processing complexity for a multiple-function chip package having a plurality of chips, but leakage and parasitic capacitance are also easily generated.

SUMMARY

One aspect of the present disclosure provides a chip package.

According to some embodiments of the present disclosure, a chip package comprises a first chip, a second chip, a first molding compound, and a first distribution line. The second chip vertically or laterally overlaps the first chip. The second chip has a conductive pad. The first molding compound covers the first chip and the second chip, and surrounds the second chip. The first molding compound has a first through hole. The conductive pad is in the first through hole. The first distribution line is located on a surface of the first molding compound facing away from the second chip, and electrically connects the conductive pad in the first through hole.

In some embodiments, a width of the first chip is greater than a width of the second chip.

In some embodiments, the first molding compound further surrounds the first chip.

In some embodiments, the first molding compound contacts a sidewall of the first chip and a sidewall of the second chip.

In some embodiments, the chip package further comprises a carrier. The first chip, the second chip, and the first molding compound are located on the carrier, and a width of the carrier is greater than a width of the first chip.

In some embodiments, the carrier has a top surface facing towards the first chip, a bottom surface facing away from the first chip, a through hole extending from the top surface to the bottom surface, and a second distribution line and a third distribution line respectively located on the top surface and the bottom surface. A first portion of the second distribution line is in the through hole of the carrier, and the third distribution line extends to the first portion of the second distribution line.

In some embodiments, the first molding compound further has a second through hole. A second portion of the second distribution line is in the second through hole of the first molding compound, and the first distribution line extends to the second portion of the second distribution line.

In some embodiments, the chip package further comprises a conductive structure. The conductive structure is located on the third distribution line of the carrier.

In some embodiments, the first chip further comprises a conductive structure. The conductive structure is located on the second distribution line of the carrier.

In some embodiments, a sidewall of the carrier is vertically aligned with a sidewall of the first molding compound.

In some embodiments, the first molding compound further has a second through hole. The chip package further comprises a second molding compound and a second distribution line. The second molding compound surrounds the first chip and is located between the first chip and the second chip. The second molding compound has a through hole. A conductive pad of the first chip is in the through hole of the second molding compound. The second distribution line is located between the first molding compound and the second molding compound, and extends to the conductive pad of the first chip and the through hole of the second molding compound. The first distribution line extends to the second distribution line in the second through hole.

In some embodiments, a sidewall of the carrier is vertically aligned with a sidewall of the second molding compound.

In some embodiments, the first chip has a top surface facing towards the second chip, and a conductive pad and a second distribution line located on the top surface. The second distribution line is located on the conductive pad of the first chip. The first molding compound further has a second through hole. A first portion of the second distribution line is in the second through hole of the first molding compound, and the first distribution line extends to the first portion of the second distribution line.

In some embodiments, the chip package further comprises a conductive structure. The conductive structure is located on the first distribution line.

In some embodiments, the first chip has a bottom surface facing away from the second chip, a through hole extending from the top surface to the bottom surface, and a third distribution line located on the bottom surface. The conductive pad of the first chip is in the through hole, and the third distribution line extends to the conductive pad of the first chip in the through hole.

In some embodiments, the first chip has a conductive pad. The first molding compound further has a second through hole. The conductive pad of the first chip is in the second through hole. The chip package further comprises a second distribution line. The second distribution line extends from the surface of the first molding compound to the conductive pad in the second through hole.

In some embodiments, the first chip is an application specific integrated circuit (ASIC) chip, and the second chip is a microelectromechanical system (MEMS) chip with a silicon cap.

Another aspect of the present disclosure provides a manufacturing method of a chip package.

According to some embodiments of the present disclosure, a manufacturing method of a chip package comprises: bonding a first chip and a second chip; forming a molding compound to cover the first chip and the second chip; forming a first through hole in the molding compound, wherein a conductive pad of the second chip is in the first through hole; and forming a first distribution line on a surface of the molding compound facing away from the second chip, wherein the first distribution line electrically connects the conductive pad in the first through hole.

In some embodiments, the manufacturing method of the chip package further comprises: forming a second distribution line on a top surface of a carrier; bonding the first chip and the second chip to the carrier, wherein the molding compound is located on the carrier after the molding compound is formed; forming a second through hole in the molding compound, wherein a first portion of the second distribution line is in the second through hole; and forming the first distribution line so that the first distribution line extends to the first portion of the second distribution line.

In some embodiments, the manufacturing method of the chip package further comprises: forming a through hole in the carrier, wherein a second portion of the second distribution line is in the through hole; and forming a third distribution line on a bottom surface of the carrier, wherein the third distribution line extends to the second portion of the second distribution line.

According to the above embodiments of the present disclosure, since the chip package has the overlapping first chip and second chip and has the first molding compound covering the first chip and the second chip, the first through hole that has a position corresponding to the conductive pad can be formed in the first molding compound, so that the first distribution line subsequently formed on the first molding compound can extend to the conductive pad in the first through hole. As a result, a size of the chip package can be determined by a size of the first molding compound, and selected sizes of the first chip and the second chip will be more flexible. Additionally, a material cost of the first molding compound is lower than a silicon chip, which can effectively reduce the material and manufacturing costs of the chip package. In addition to that, the first distribution line can be electrically connected to the conductive pad via the first through hole of the first molding compound without the necessity for the first chip and the second chip to undergo an etching process to form a through hole that exposes the conductive pad. Such a configuration not only facilitates the manufacturing of the multiple-function chip package having a plurality of chips, but leakage and parasitic capacitance are also not easily generated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
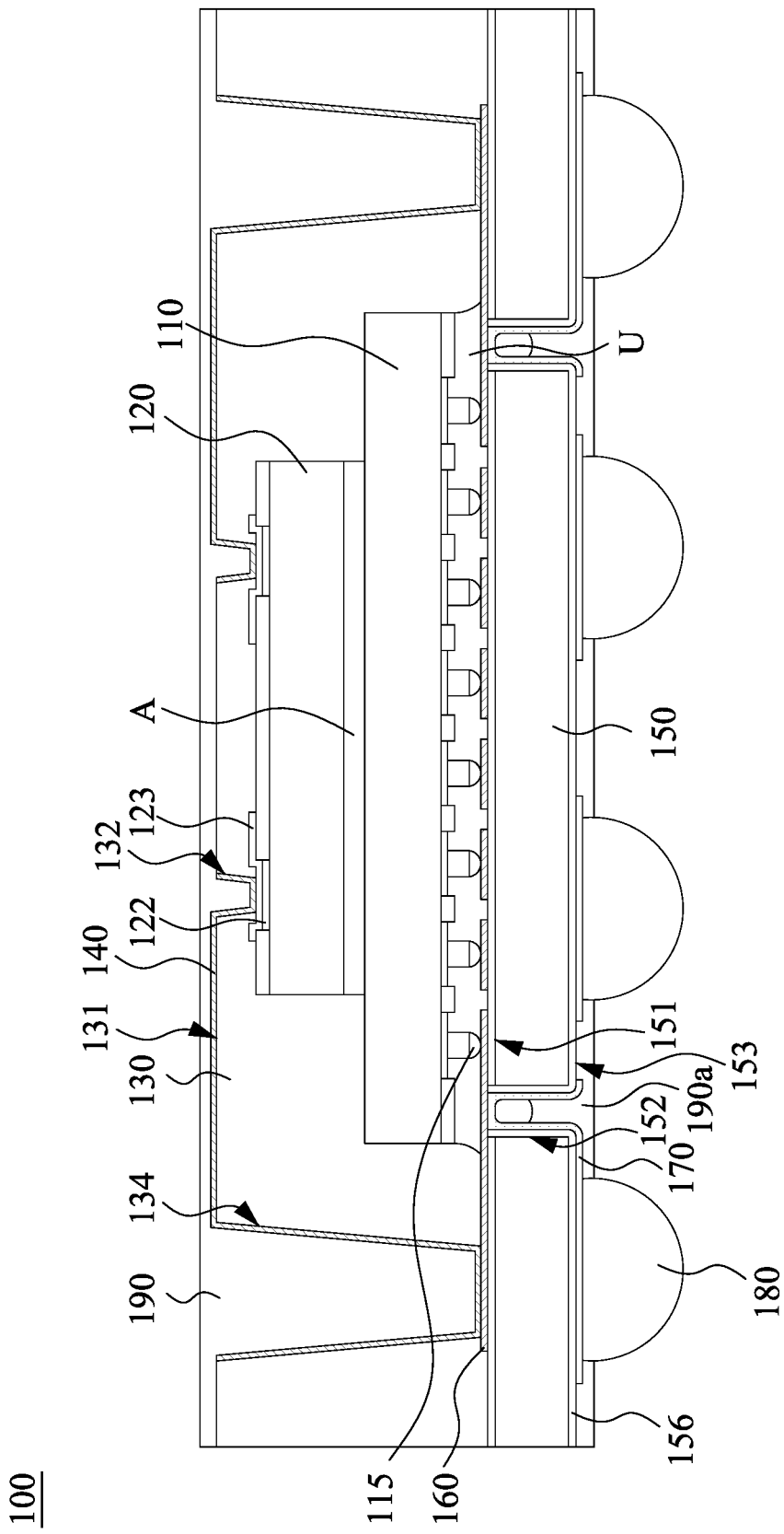
FIG. 1 is a cross-sectional view of a chip package according to one embodiment of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate relationships between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

FIG. 1 is a cross-sectional view of a chip package 100 according to one embodiment of the present disclosure. As shown in the figure, the chip package 100 comprises a first chip 110, a second chip 120, a first molding compound 130, and a first distribution line 140. The second chip 120 overlaps the first chip 110. In the present embodiment, the second chip 120 vertically overlaps the first chip 110. The second chip 120 is located on the first chip 110, for example, is bonded by an adhesive layer A. The adhesive layer A may be a die attach film (DAF). A material of each of the first chip 110 and the second chip 120 comprises silicon, which may have circuits inside and are silicon chips having different built-in functions. The second chip 120 has conductive pads 122. The first molding compound 130 covers the first chip 110 and the second chip 120, and surrounds the second chip 120. The first molding compound 130 has first through holes 132. The conductive pads 122 of the second chip 120 are in the first through holes 132 of the first molding compound 130. The first distribution line 140 is located on a surface 131 of the first molding compound 130 facing away from the second chip 120, and electrically connects the conductive pads 122 in the first through holes 132.

Because the chip package 100 has the overlapping first chip 110 and second chip 120, and has the first molding compound 130 covering the first chip 110 and the second chip 120, each of the first through holes 132 that has a position corresponding to the conductive pad 122 can be formed in the first molding compound 130, so that the first distribution line 140 subsequently formed on the first molding compound 130 can extend to the conductive pads 122 in the first through holes 132. As a result, a size of the chip package 100 can be determined by a size of the first molding compound 130, and selected sizes of the first chip 110 and the second chip 120 will be more flexible. Additionally, a material cost of the first molding compound 130 is lower than a silicon chip, which can effectively reduce the material and manufacturing costs of the chip package 100. In addition to that, the first distribution line 140 can be electrically connected to the conductive pads 122 via the first through holes 132 of the first molding compound 130 without the necessity for the first chip 110 and the second chip 120 to undergo an etching process to form through holes that expose the conductive pads 122. Such a configuration not only facilitates the manufacturing of the multiple-function chip package 100 having a plurality of chips, but leakage and parasitic capacitance are also not easily generated.

In the present embodiment, a width of the first chip 110 is greater than a width of the second chip 120. The first molding compound 130 surrounds the first chip 110 and the second chip 120. In addition, the first molding compound 130 contacts a sidewall of the first chip 110 and a sidewall of the second chip 120.

The chip package 100 further comprises a carrier 150. According to the present embodiment, a material of the carrier 150 comprises silicon, and the carrier 150 is a silicon chip that can be used as an interposer. The carrier 150 has electrical connection usage but has no built-in function. The first chip 110, the second chip 120, and the first molding compound 130 are located on the carrier 150, and a width of the carrier 150 is greater than the width of the first chip 110 and the width of the second chip 120. The carrier 150 can provide the first molding compound 130 with a supporting force, so that the first molding compound 130 can surround the first chip 110 and the second chip 120, thus increasing the size (such as width and thickness) of the chip package 100.

The carrier 150 has a top surface 151 facing towards the first chip 110, a bottom surface 153 facing away from the first chip 110, through holes 152 extending from the top surface 151 to the bottom surface 153, and a second distribution line 160 and a third distribution line 170 respectively located on the top surface 151 and the bottom surface 153. A first portion of the second distribution line 160 is in the through holes 152 of the carrier 150, and the third distribution line 170 extends to the first portion of the second distribution line 160. Additionally, the first molding compound 130 may further have second through holes 134. The first through holes 132 and the second through holes 134 may be formed by using laser drilling. A second portion of the second distribution line 160 is in the second through holes 134 of the first molding compound 130, and the first distribution line 140 extends to the second portion of the second distribution line 160. Through the above configuration, the third distribution line 170 can be electrically connected to the first distribution line 140 through the second distribution line 160.

In the present embodiment, since a sidewall of the carrier 150 and a sidewall of the first molding compound 130 can be formed in a same dicing process, the sidewall of the carrier 150 is vertically aligned with the sidewall of the first molding compound 130.

In addition to that, the chip package 100 may further comprise conductive structures 180. The conductive structures 180 are located on the third distribution line 170 of the carrier 150. The conductive structure 180 may be in a spherical (such as a solder ball) or columnar shape, but the present disclosure is not limited in this regard. The conductive structures 180 may electrically connect to other electronic device(s) (such as a circuit board). The first chip 110 may comprise conductive structures 115. The conductive structures 115 are located on the second distribution line 160 of the carrier 150 and may be surrounded by insulating filler U. In the present embodiment, each of the conductive structures 115 may be a micro bump, but the present disclosure is not limited in this regard. Through the above configuration, the first chip 110 and the second chip 120 can be electrically connected to each other through the first distribution line 140 and the second distribution 160, and the first chip 110 and the second chip 120 can both be electrically connected to the conductive structures 180 so as to transmit electrical signals with other electronic device(s) (such as a printed circuit board).

According to the present embodiment, a material of each of the first distribution line 140, the second distribution line 160, and the third distribution line 170 may comprise copper, silver, or aluminum, and each of them may be formed by using physical vapor deposition (such as sputtering).

The chip package 100 may further comprise protective layers 190, 190a. The protective layer 190 covers the first molding compound 130. The first distribution line 140 is located between the protective layer 190 and the first molding compound 130. The protective layer 190a covers the bottom surface 153 of the carrier 150. The third distribution line 170 is located between the protective layer 190a and the carrier 150. A material of each of the protective layers 190, 190a may be a polymer, which can be used as a passivation layer, a planarization layer, a solder mask, and an insulating layer.

It is to be noted that the aforementioned connection relationships, materials, and effects of the elements are not be repeated. In the following description, a manufacturing method of a chip package is described.

Figure 2:
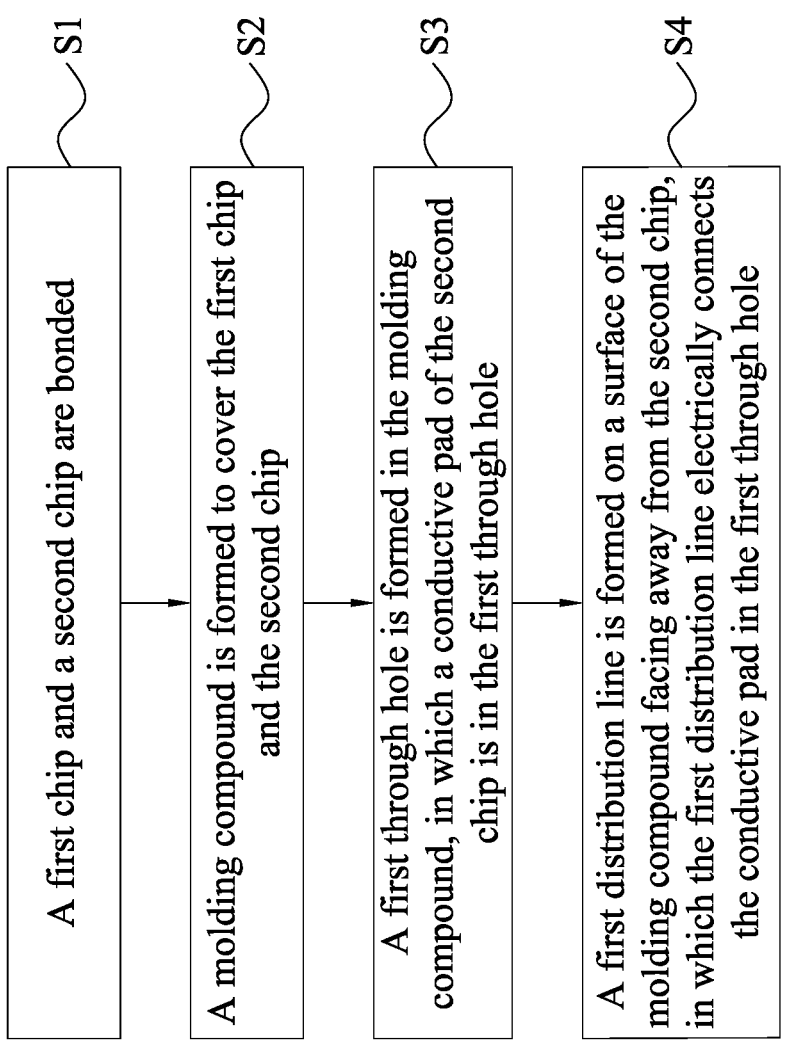
FIG. 2 is a flowchart of a manufacturing method of a chip package according to one embodiment of the present disclosure.
Figure 3:
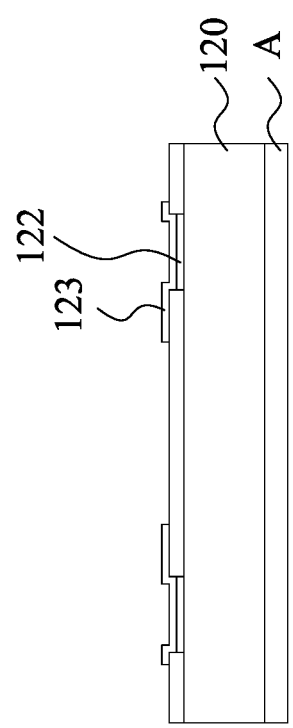
FIG. 3 to FIG. 12 are cross-sectional views of a manufacturing method of the chip package of FIG. 1 at different stages.
Figure 4:
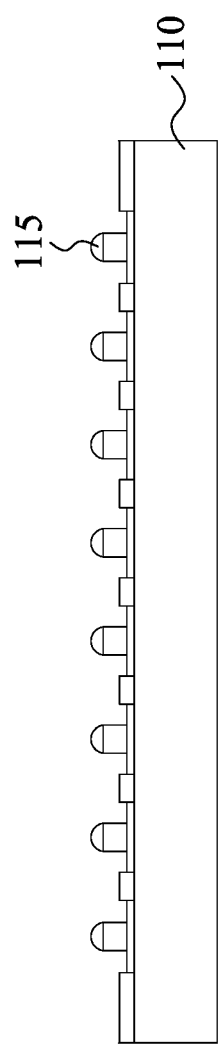
Figure 5:
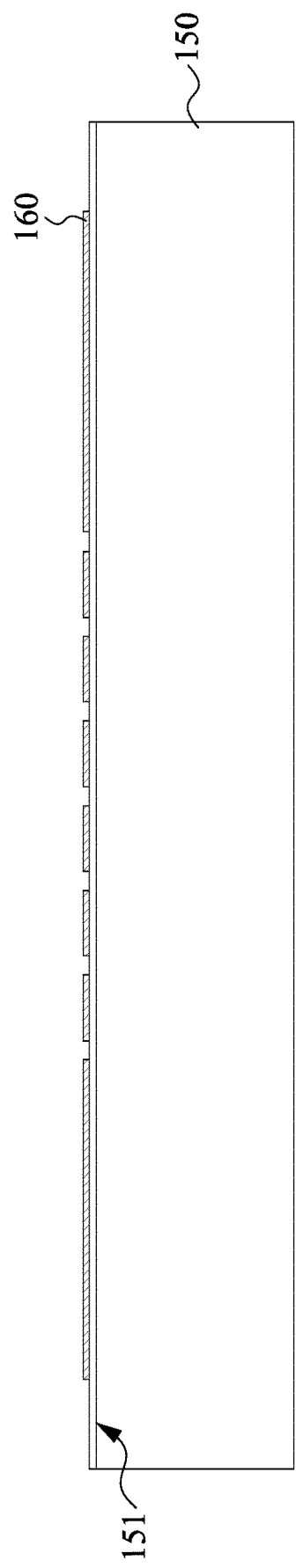

FIG. 2 is a flowchart of a manufacturing method of a chip package according to one embodiment of the present disclosure. The manufacturing method of the chip package comprises the following steps. First, in step S1, a first chip and a second chip are bonded. Then, in step S2, a molding compound is formed to cover the first chip and the second chip. After that, in step S3, a first through hole is formed in the molding compound, in which a conductive pad of the second chip is in the first through hole. Thereafter, in step S4, a first distribution line is formed on a surface of the molding compound facing away from the second chip, in which the first distribution line electrically connects the conductive pad in the first through hole.

In the following description, the above steps are explained in detail.

FIG. 3 to FIG. 12 are cross-sectional views of a manufacturing method of the chip package 100 of FIG. 1 at different stages. A description is provided with reference to FIG. 3. The second chip 120 has the conductive pads 122. A patterned distribution line 123 is formed on the second chip 120, and electrically connects the conductive pads 122. "Patterned" may refer to the result caused by photolithography techniques, such as exposure, development, and etching, etc. After the distribution line 123 is formed, a surface of the second chip 120 facing away from the conductive pads 122 can be ground, and the adhesive layer A (such as a die attach film) is attached, and a structure of FIG. 3 can thereafter be obtained through a dicing process. A description is provided with reference to FIG. 4. After the first chip 110 is cleaned, the conductive structures 115 can be formed on the first chip 110. Each of the conductive structures 115 may be a micro bump. After the conductive structures 115 are formed, a surface of the first chip 110 facing away from the conductive structures 115 can be ground, and a structure of FIG. 4 can thereafter be obtained through a dicing process. A description is provided with reference to FIG. 5. The carrier 150 does not have any conductive pad. The patterned second distribution line 160 can be formed on the top surface 151 of the carrier 150.

Figure 6:
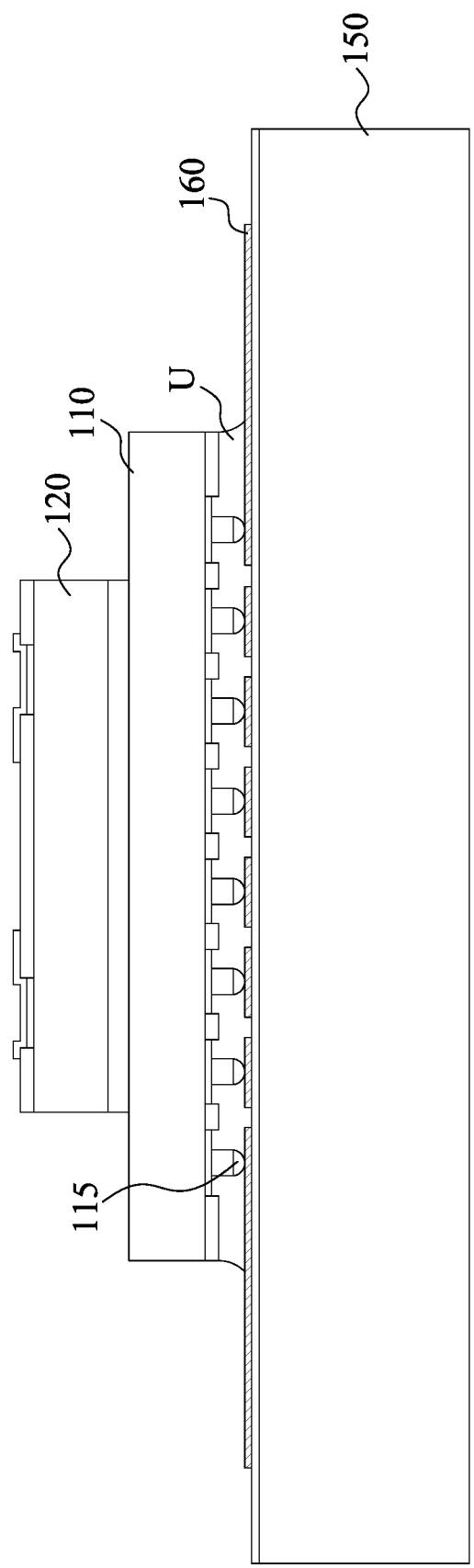
Figure 7:
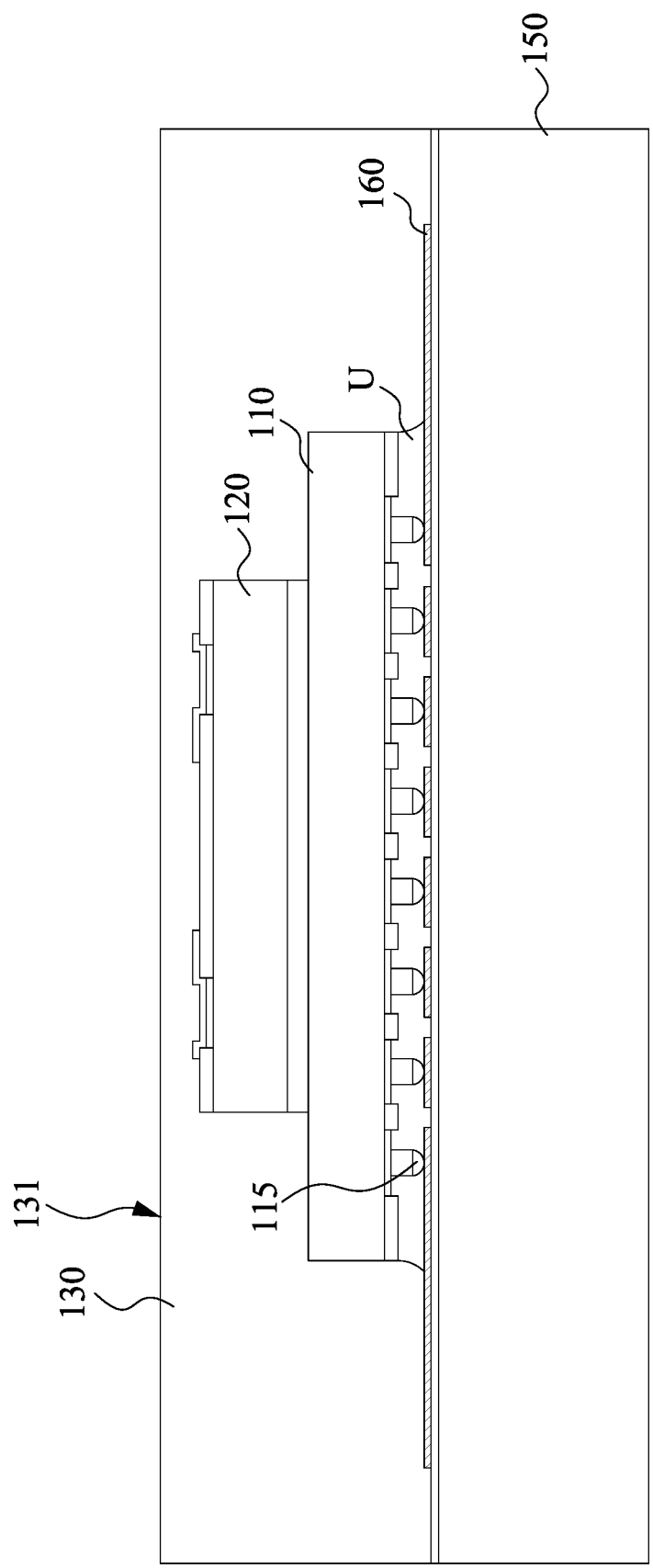
Figure 8:
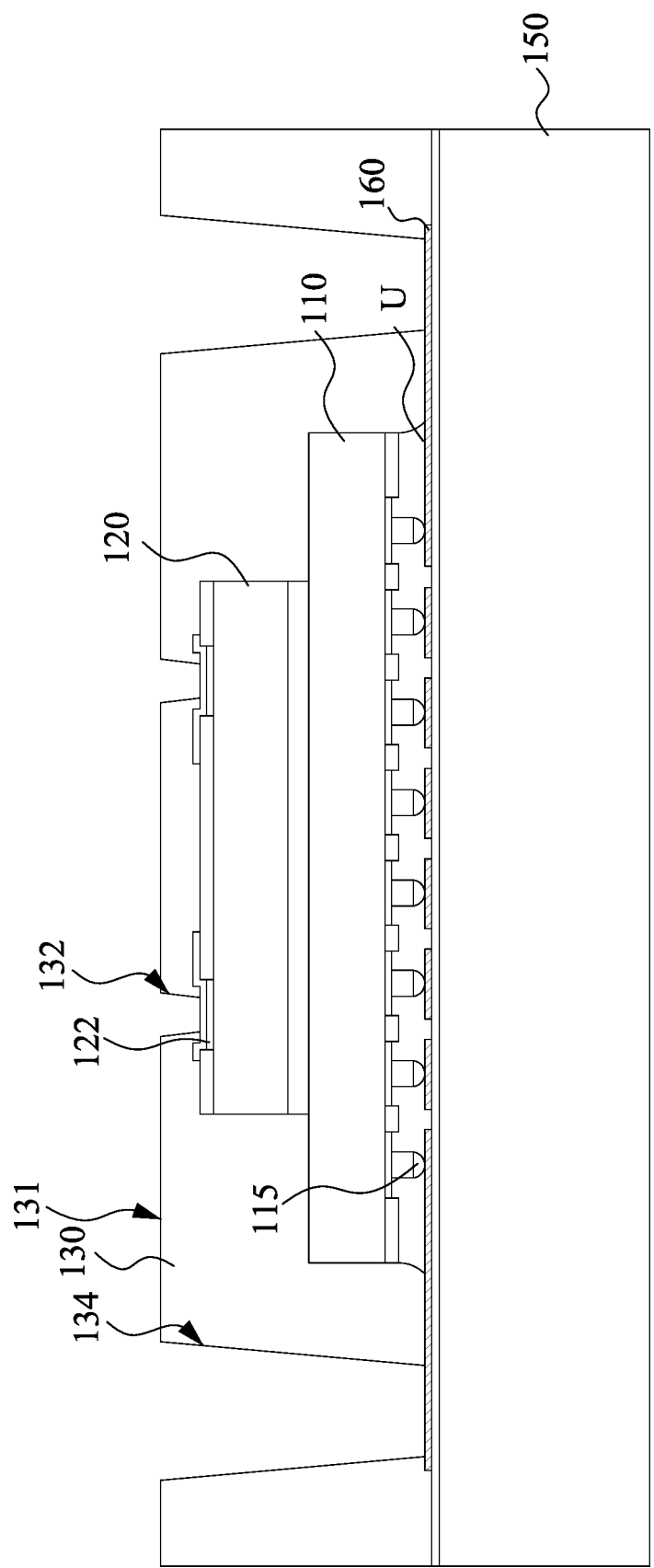

A description is provided with reference to FIG. 6. The second chip 120 can be attached to the first chip 110 by utilizing the adhesive layer A, and the conductive structures 115 of the first chip 110 can be bonded to the second distribution line 160 of the carrier 150. As a result, the stacked first chip 110 and second chip 120 are bonded to the carrier 150. A description is provided with reference to FIG. 7. After a structure of FIG. 6 is completed, the first molding compound 130 can be formed to cover the first chip 110 and the second chip 120. After the first molding compound 130 is formed, the first molding compound 130 is located on the carrier 150. A description is provided with reference to FIG. 8. Then, laser drilling can be utilized to form the first through holes 132 and the second through holes 134 in the first molding compound 130, in which the conductive pads 122 of the second chip 120 are in the first through holes 132 and a first portion of the second distribution line 160 is in the second through holes 134.

Figure 9:
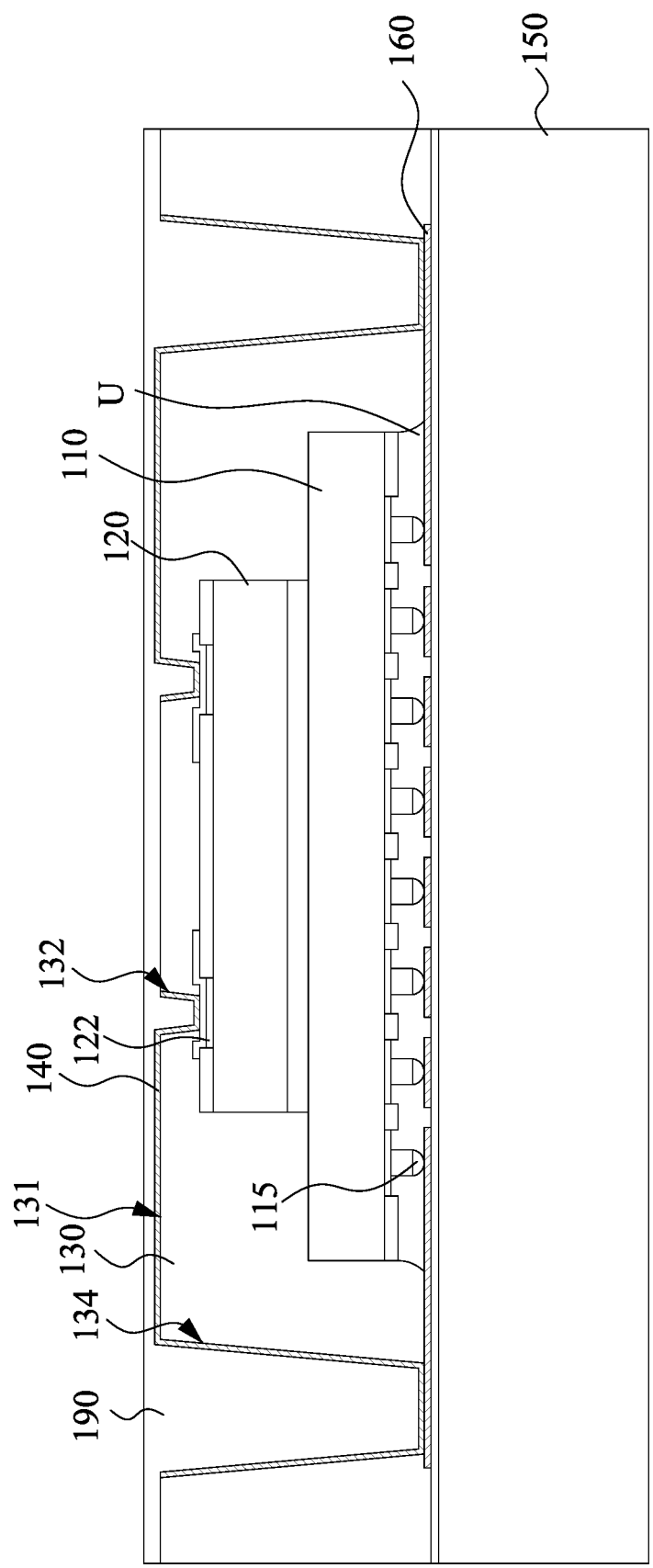

A description is provided with reference to FIG. 9. After the first through holes 132 and the second through holes 134 of the first molding compound 130 are formed, the first distribution line 140 can be formed on the surface 131 of the first molding compound 130 facing away from the second chip 120, in which the first distribution line 140 electrically connects the conductive pads 122 in the first through holes 132. In addition, in the step of forming the first distribution line 140, the first distribution line 140 can further extend to the first portion of the second distribution line 160. Therefore, the second chip 120 can be electrically connected to the first chip 110 through the first distribution line 140 and the second distribution line 160. After that, the protective layer 190 can be formed to cover the first molding compound 130 and the first distribution line 140.

Figure 10:
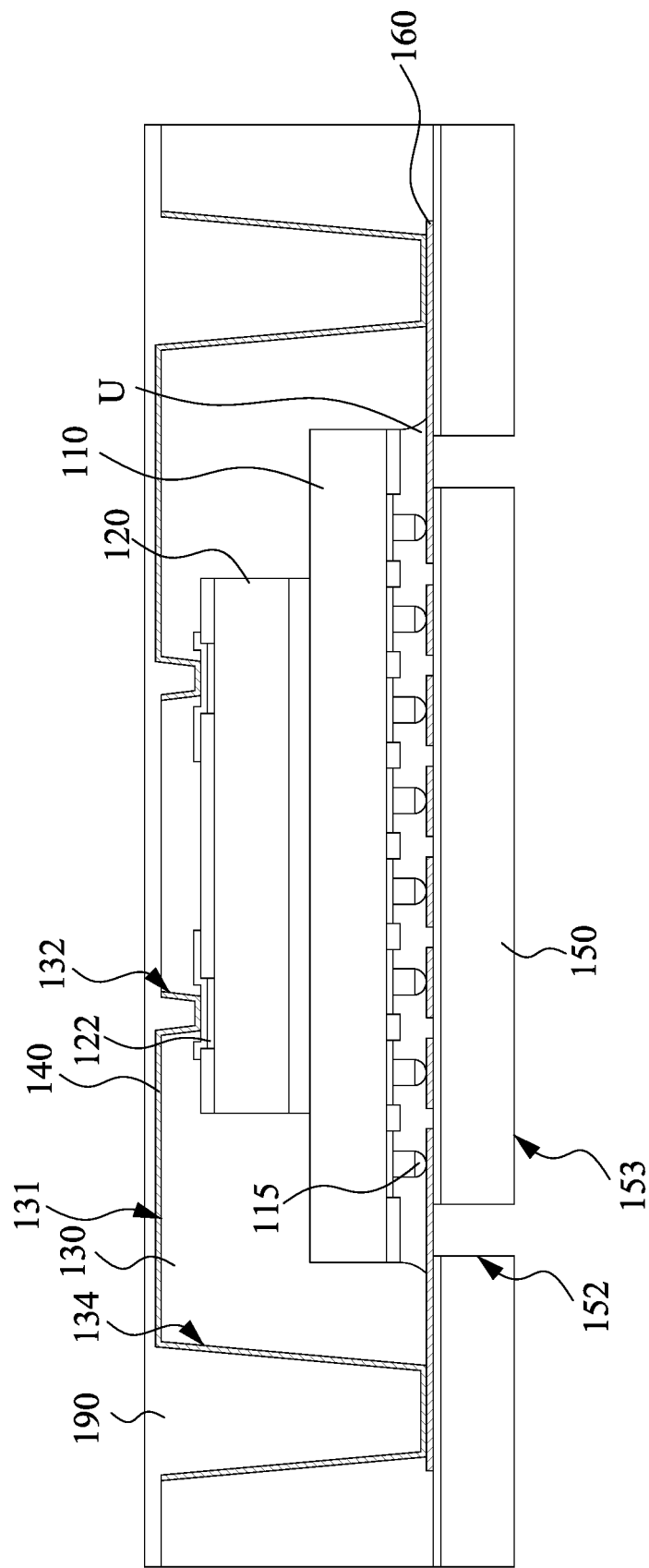

A description is provided with reference to FIG. 10. After the protective layer 190 is formed, the bottom surface 153 of the carrier 150 can be ground to thin the carrier 150. The through holes 152 can thereafter be formed in the carrier 150, in which a second portion of the second distribution line 160 is in the through holes 152.

Figure 11:
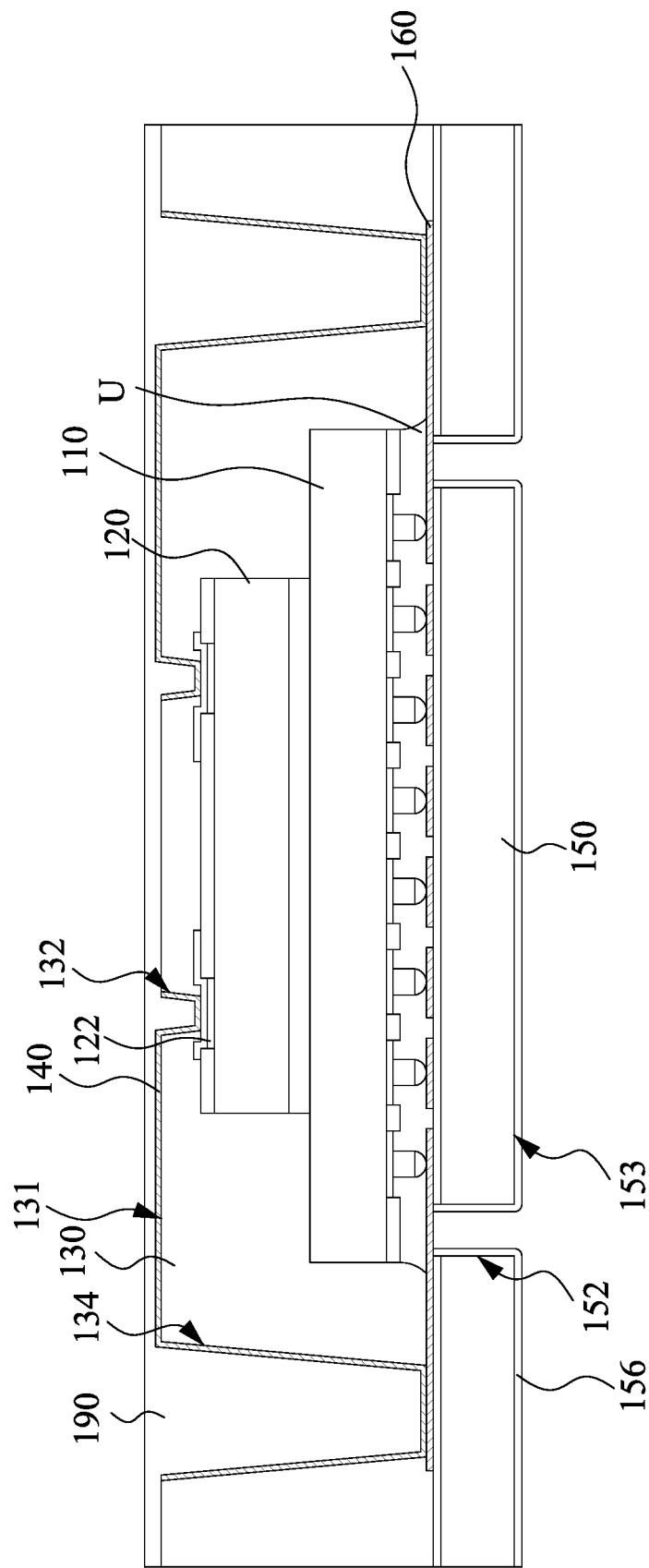

A description is provided with reference to FIG. 11. Then, an insulating layer 156 can be formed on the bottom surface 153 of the carrier 150 and wall surfaces of the carrier 150 surrounding the through holes 152.

Figure 12:
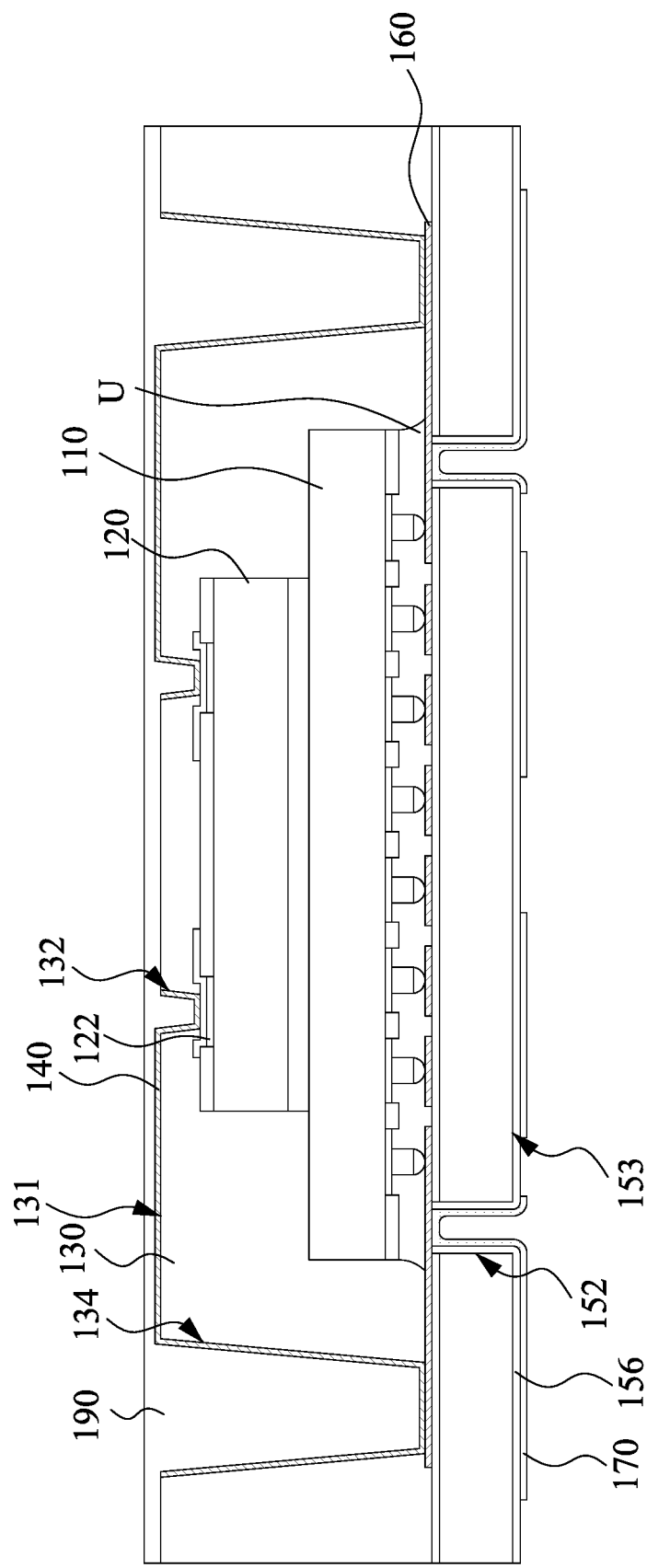

A description is provided with reference to FIG. 12. After the insulating layer 156 is formed, the third distribution line 170 can be formed on the bottom surface 153 of the carrier 150, in which the third distribution line 170 extends to the second portion of the second distribution line 160 in the through holes 152. In the subsequent processes, a description is provided with reference to FIG. 12 and FIG. 1, the protective layer 190a can be formed to cover the bottom surface 153 of the carrier 150. After that, openings are formed in the protective layer 190a, and the conductive structures 180 are disposed on the third distribution line 170 in the openings of the protective layer 190a.

After the conductive structures 180 are disposed, a dicing process can be performed on the wafer-level carrier 150 and the first molding compound 130 to obtain one or more chip-scale chip packages 100 as shown in FIG. 1.

In the following description, other types of chip packages are described.

Figure 13:
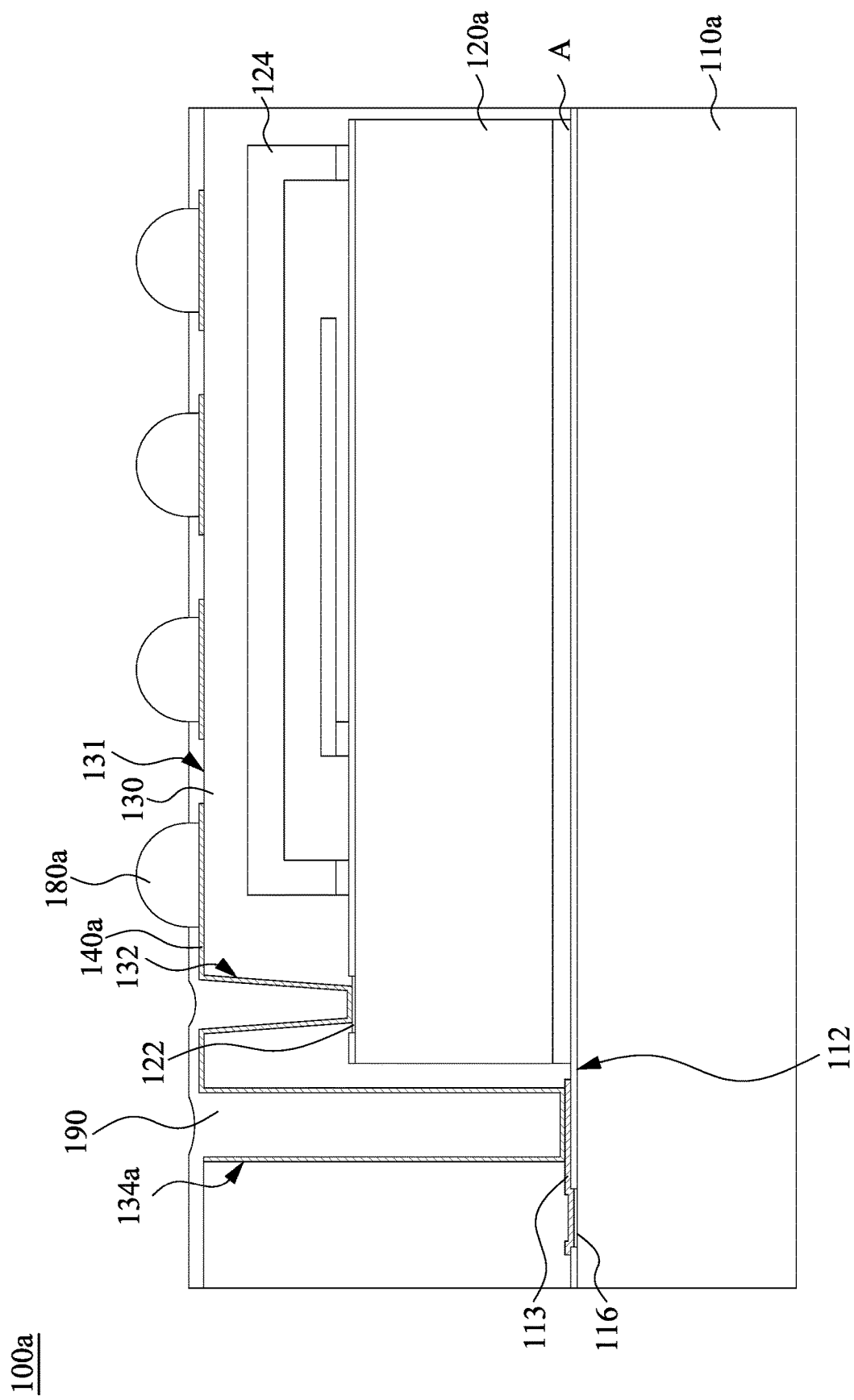
FIG. 13 is a cross-sectional view of a chip package according to another embodiment of the present disclosure.

FIG. 13 is a cross-sectional view of a chip package 100a according to another embodiment of the present disclosure. The chip package 100a comprises a first chip 110a, a second chip 120a, the first molding compound 130, and a first distribution line 140a. A difference between the present embodiment and the embodiment shown in FIG. 1 lies in that the chip package 100a does not have the carrier 150 of FIG. 1, and the entire first molding compound 130 is located above the first chip 110a. Additionally, the first chip 110a has a top surface 112 facing towards the second chip 120a, and a conductive pad 116 and a second distribution line 113 located on the top surface 112. The second distribution line 113 is located on the conductive pad 116 and electrically connected to the conductive pad 116. The first molding compound 130 has a second through hole 134a. A first portion of the second distribution line 113 is in the second through hole 134a of the first molding compound 130, and the first distribution line 140a extends to the first portion of the second distribution line 113. In the present embodiment, the chip package 100a further comprises conductive structures 180a. The conductive structures 180a are located on the first distribution line 140a.

Through the above configuration, the second chip 120a can be electrically connected to the first chip 110a through the first distribution line 140a and the second distribution line 113.

In some embodiments, the first chip 110a may be an application specific integrated circuit (ASIC) chip, and the second chip 120a may be a microelectromechanical system (MEMS) chip with a silicon cap (Si cap) 124. However, the present disclosure is not limited in this regard.

Figure 14:
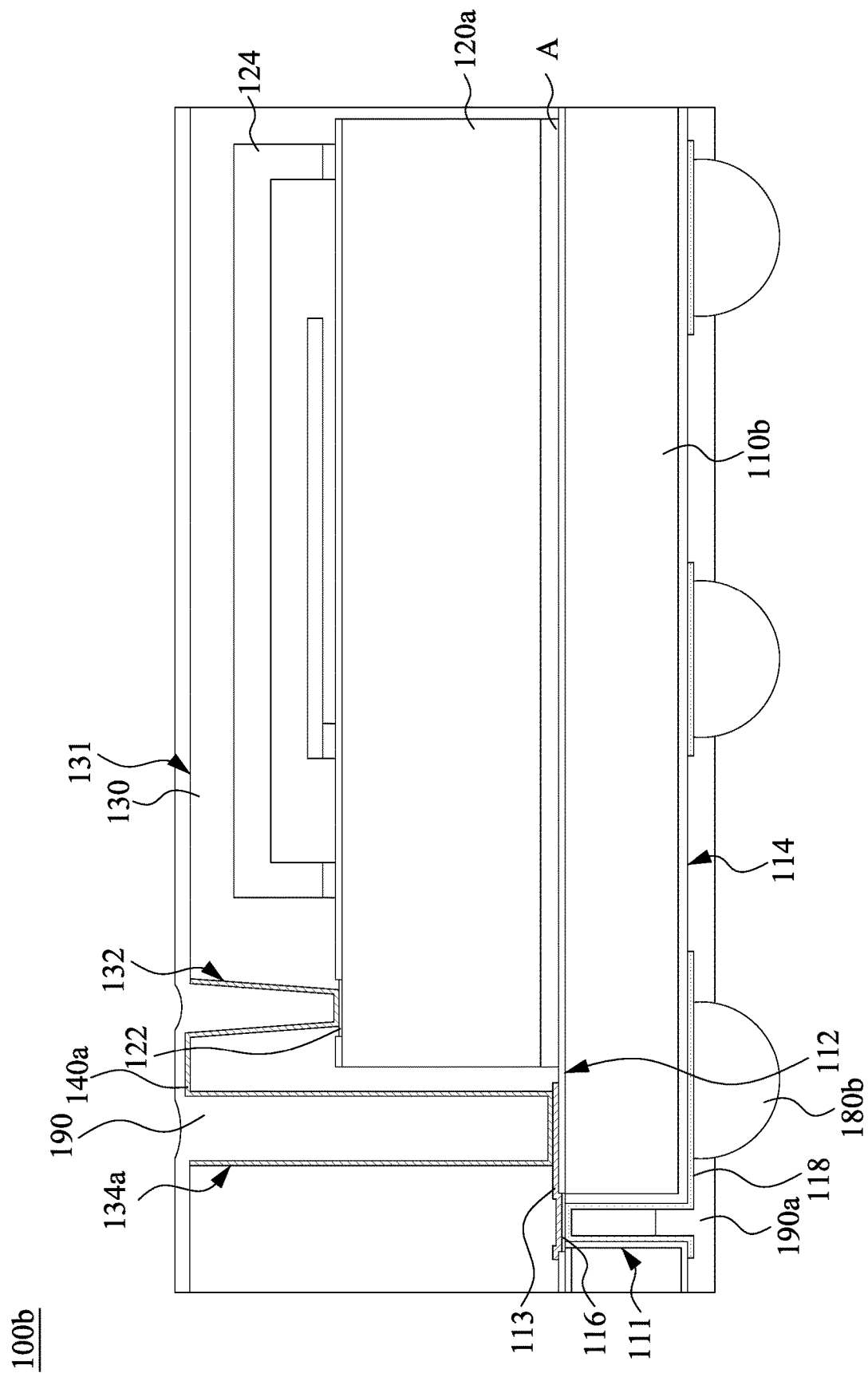
FIG. 14 is a cross-sectional view of a chip package according to still another embodiment of the present disclosure.

FIG. 14 is a cross-sectional view of a chip package 100b according to still another embodiment of the present disclosure. The chip package 100b comprises a first chip 110b, the second chip 120a, the first molding compound 130, the first distribution line 140a, and the second distribution line 113. The first chip 110b has a bottom surface 114 facing away from the second chip 120a. A difference between the present embodiment and the embodiment shown in FIG. 13 lies in that the first chip 110b has a through hole 111 extending from the top surface 112 to the bottom surface 114 and a third distribution line 118 located on the bottom surface 114. In addition to that, the conductive pad 116 of the first chip 110b is in the through hole 111, and the third distribution line 118 extends to the conductive pad 116 in the through hole 111. In the present embodiment, the chip package 100b further comprises conductive structures 180b. The conductive structures 180b are located on the third distribution line 118.

Through the above configuration, the second chip 120a can be electrically connected to the first chip 110b through the first distribution line 140a and the second distribution line 113, and the first chip 110b and the second chip 120a can transmit electrical signals with external electronic device(s) through the third distribution line 118 and the conductive structures 180b.

Figure 15:
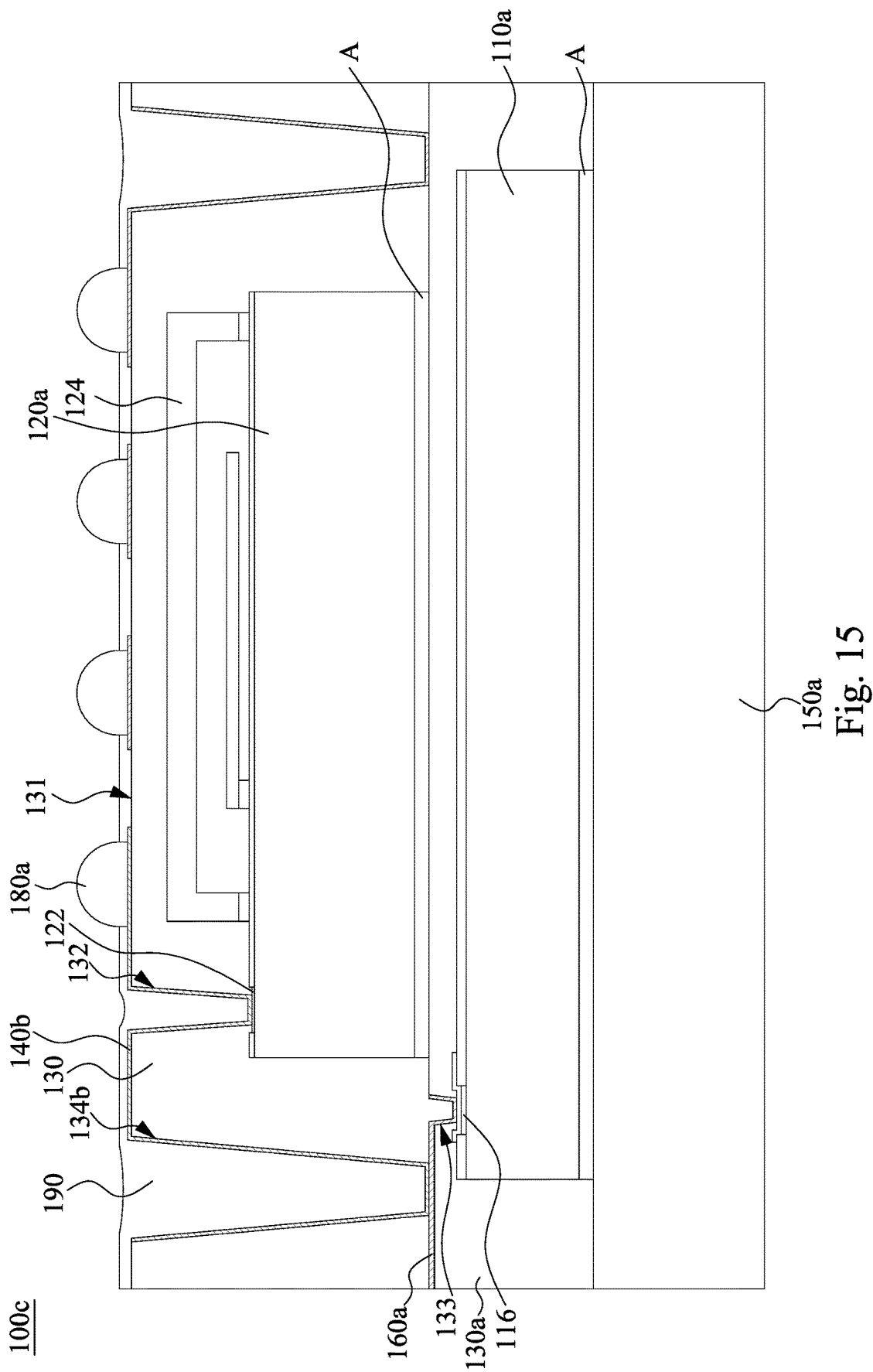
FIG. 15 is a cross-sectional view of a chip package according to yet another embodiment of the present disclosure.

FIG. 15 is a cross-sectional view of a chip package 100c according to yet another embodiment of the present disclosure. The chip package 100c comprises the first chip 110a, the second chip 120a, the first molding compound 130, a first distribution line 140b, and a carrier 150a. The first molding compound 130 has the first through hole 132 and second through holes 134b. The chip package 110c further comprises a second molding compound 130a and a second distribution line 160a. The second molding compound 130a surrounds the first chip 110a and is located between the first chip 110a and the second chip 120a. The second molding compound 130a has a through hole 133. The conductive pad 116 of the first chip 110a is in the through hole 133 of the second molding compound 130a. The second distribution line 160a is located between the first molding compound 130 and the second molding compound 130a and extends to the conductive pad 116 of the first chip 110a and the through hole 133 of the second molding compound 130a. The first distribution line 140b extends to the second distribution line 160a in the second through hole 134b of the first molding compound 130.

In the present embodiment, the first chip 110a may be an application specific integrated circuit chip, and the second chip 120a may be a microelectromechanical system chip with the silicon cap 124. However, the present disclosure is not limited in this regard. A material of the carrier 150a comprises glass, and the carrier 150a is a glass plate that can be used as a support element. The carrier 150a does not have electrical connection usage and built-in functions.

Through the above configuration, the second chip 120a can be electrically connected to the first chip 110a through the first distribution line 140b and the second distribution line 160a, and the first chip 110b and the second chip 120a can transmit electrical signals with external electronic device(s) through the conductive structures 180a.

Figure 16:
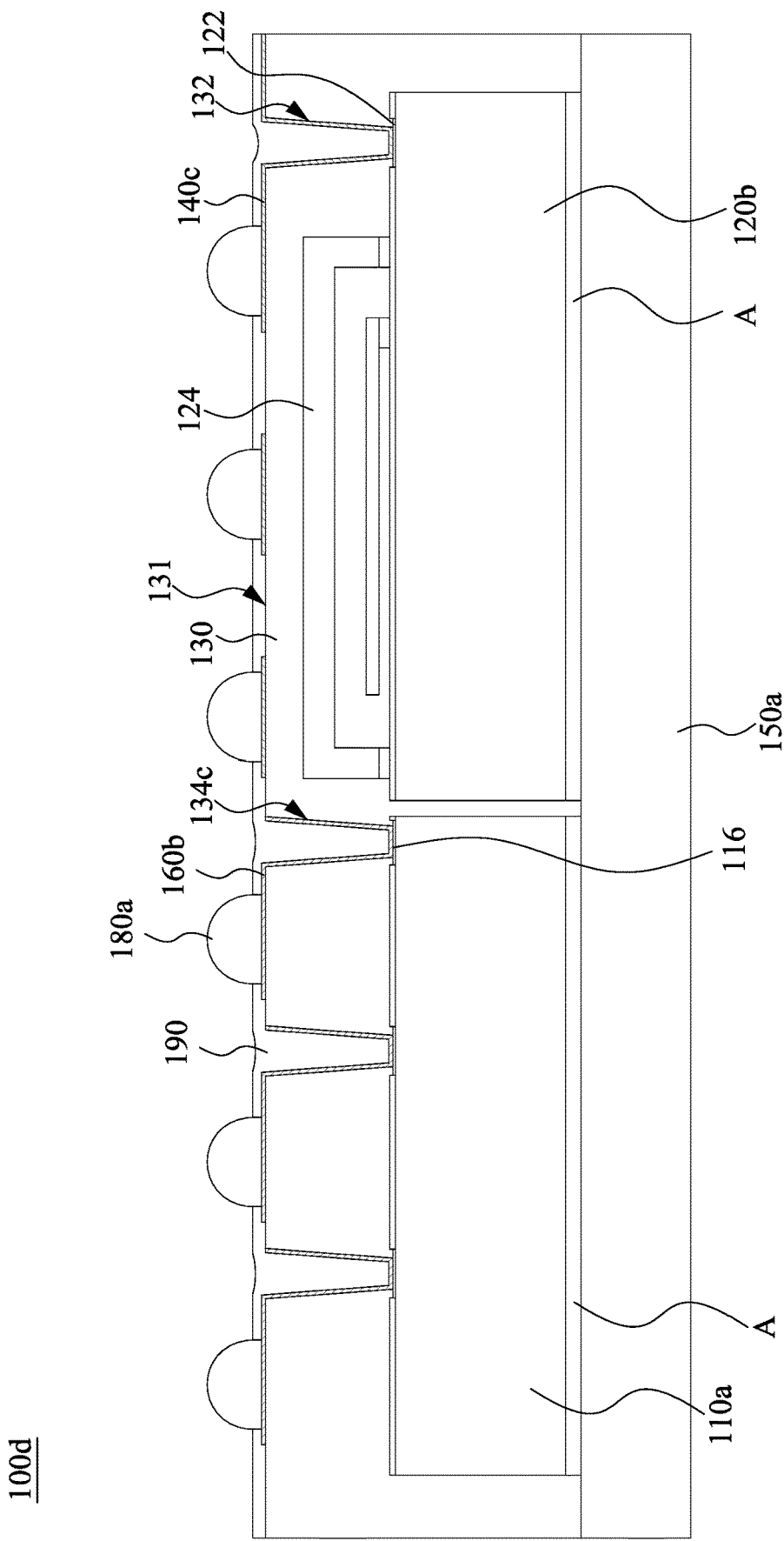
FIG. 16 is a cross-sectional view of a chip package according to one embodiment of the present disclosure.

FIG. 16 is a cross-sectional view of a chip package 100d according to one embodiment of the present disclosure. The chip package 100d comprises the first chip 110a, a second chip 120b, the first molding compound 130, a first distribution line 140c, a second distribution line 160b, and the carrier 150a. The second chip 120b laterally overlaps the first chip 110a. The first chip 110a and the second chip 120b are bonded to the carrier 150a by the adhesive layer A. The first chip 110a has the conductive pads 116. The second chip 120b has the conductive pad 122. The first molding compound 130 covers the first chip 110a and the second chip 120b, and surrounds first chip 110a and the second chip 120b. The first molding compound 130 has the first through hole 132 and second through holes 134c. The conductive pads 116 of the first chip 110a are in the second through holes 134c. The conductive pad 122 of the second chip 120b is in the first through hole 132. The first distribution line 140c is located on the surface 131 of the first molding compound 130 facing away from the second chip 120b, and electrically connects the conductive pad 122 in the first through hole 132. The second distribution line 160b extends from the surface 131 of the first molding compound 130 to the conductive pads 116 in the second through holes 134c.

In the present embodiment, the first chip 110a may be an application specific integrated circuit chip, and the second chip 120b may be a microelectromechanical system chip with the silicon cap 124. However, the present disclosure is not limited in this regard. A material of the carrier 150a comprises glass, and the carrier 150a is a glass plate that is used as a support element.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip package comprising:
   a first chip;
   a second chip vertically overlapping the first chip, the second chip having a conductive pad;
   a first molding compound covering the first chip and the second chip, and surrounding the second chip, wherein the first molding compound has a first through hole, the conductive pad is in the first through hole;
   a first distribution line located on a surface of the first molding compound facing away from the second chip, and electrically connecting the conductive pad in the first through hole; and
   a carrier having a top surface facing towards the first chip, a bottom surface facing away from the first chip, a through hole extending from the top surface to the bottom surface, and having a second distribution line and a third distribution line respectively located on the top surface and the bottom surface, wherein an entirety of the second distribution line is flat, and the second distribution line extends across the through hole of the carrier and in contact with the first distribution line and the third distribution line.

2. The chip package of claim 1, wherein a width of the first chip is greater than a width of the second chip.

3. The chip package of claim 1, wherein the first molding compound further surrounds the first chip.

4. The chip package of claim 1, wherein the first molding compound contacts a sidewall of the first chip and a sidewall of the second chip.

5. The chip package of claim 1,
   wherein the first chip, the second chip, and the first molding compound are located on the carrier, and a width of the carrier is greater than a width of the first chip.

6. The chip package of claim 5, wherein a first portion of the second distribution line is in the through hole of the carrier, and the third distribution line extends to the first portion of the second distribution line.

7. The chip package of claim 6, wherein the first molding compound further has a second through hole, a second portion of the second distribution line is in the second through hole of the first molding compound, and the first distribution line extends to the second portion of the second distribution line.

8. The chip package of claim 6, further comprising:
   a conductive structure located on the third distribution line of the carrier.

9. The chip package of claim 6, wherein the first chip further comprises:
   a conductive structure located on the second distribution line of the carrier.

10. The chip package of claim 5, wherein a sidewall of the carrier is vertically aligned with a sidewall of the first molding compound.

11. A manufacturing method of a chip package, comprising:
- bonding a first chip and a second chip;
- forming a second distribution line on a top surface of a carrier;
- bonding the first chip and the second chip to the carrier, wherein the top surface of the carrier faces towards the first chip, and a bottom surface of the carrier faces away from the first chip;
- forming a molding compound to cover the first chip and the second chip;
- forming a first through hole in the molding compound, wherein a conductive pad of the second chip is in the first through hole;
- forming a first distribution line on a surface of the molding compound facing away from the second chip, wherein the first distribution line electrically connects the conductive pad in the first through hole;
- forming a through hole extending from the top surface of the carrier to the bottom surface of the carrier; and
- forming a third distribution line on the bottom surface of the carrier, wherein an entirety of the second distribution line is flat, and the second distribution line extends across the through hole of the carrier and in contact with the first distribution line and the third distribution line.

12. The manufacturing method of the chip package of claim 11, wherein the molding compound is located on the carrier after the molding compound is formed, the method further comprising:
- forming a second through hole in the molding compound, wherein a first portion of the second distribution line is in the second through hole; and
- forming the first distribution line so that the first distribution line extends to the first portion of the second distribution line.

13. The manufacturing method of the chip package of claim 12, wherein:
- forming the through hole is performed such that a second portion of the second distribution line is in the through hole; and
- forming the third distribution line on the bottom surface of the carrier is performed such that the third distribution line extends to the second portion of the second distribution line.

* * * * *